United States Patent [19]

Azad

[11] Patent Number: 5,162,072
[45] Date of Patent: Nov. 10, 1992

[54] APPARATUS AND METHOD FOR CONTROL OF MELT FLOW PATTERN IN A CRYSTAL GROWTH PROCESS

[75] Inventor: Farzin H. Azad, Clifton Park, N.Y.

[73] Assignee: General Electric Company, Schenectady, N.Y.

[21] Appl. No.: 625,392

[22] Filed: Dec. 11, 1990

[51] Int. Cl.$^5$ ............................................. C30B 15/00
[52] U.S. Cl. ................... 156/619.1; 156/601; 156/617.1; 156/618.1; 422/246; 422/249
[58] Field of Search ................. 156/601, 617.1, 618.1, 156/619.1; 422/246, 249

[56] References Cited

U.S. PATENT DOCUMENTS

| | | |
|---|---|---|
| 4,133,969 | 1/1979 | Zumbrunnen .................... 156/617.1 |
| 4,233,270 | 11/1987 | Schmidt . |
| 4,239,583 | 12/1980 | Hatch et al. ..................... 156/619.1 |
| 4,350,557 | 9/1982 | Scholl et al. ......................... 156/601 |
| 4,478,676 | 10/1984 | Belt et al. . |
| 4,654,110 | 3/1987 | Morrison . |
| 4,659,421 | 4/1987 | Jewett . |
| 4,687,646 | 8/1987 | Matgeika et al. . |
| 4,734,267 | 3/1988 | Kojima ................................ 422/249 |
| 4,830,703 | 5/1989 | Matsutani . |

FOREIGN PATENT DOCUMENTS 0182298 10/1984 Japan ................... 156/601

OTHER PUBLICATIONS

Automatic Czochralski Growth, Growth Parameter Measurements and Process Control; Uelhoff; pp. 278-279; *Journal of Crystal Growth* 65 (1985).

*Primary Examiner*—Robert Kunemund
*Assistant Examiner*—Felisa Garrett
*Attorney, Agent, or Firm*—Marilyn Glaubensklee; James C. Davis, Jr.; Paul R. Webb, II

[57] ABSTRACT

An apparatus and method for control of a shape of a solidification interface in a Czochralski crystal pulling process are provided wherein a bottom heater is disposed below the bottom of the crucible, the bottom heater having a plurality of individually controllable heating elements which are selectively controlled to produce a desired radial temperature distribution across the bottom of the crucible, thereby influencing the flow pattern within the melt.

17 Claims, 4 Drawing Sheets

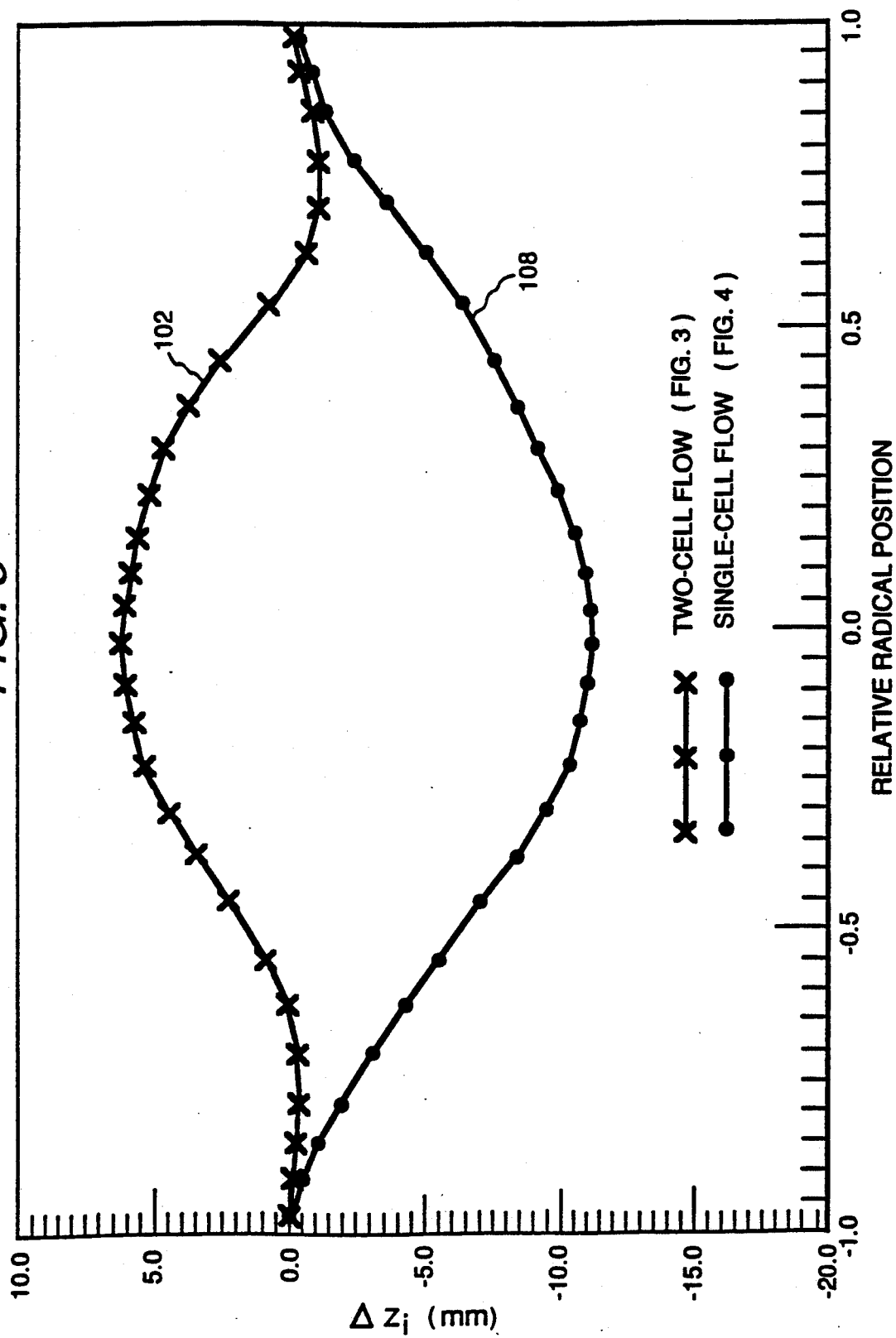

APPARATUS AND METHOD FOR CONTROL OF MELT FLOW PATTERN IN A CRYSTAL GROWTH PROCESS

BACKGROUND OF THE INVENTION

1. Field of the Invention

The present invention relates to an apparatus and method for control of a melt flow pattern within a crucible, and more specifically to controlling a radial temperature gradient or distribution during crystal growth by the Czochralski method.

The well-known Czochralski method of growing crystals involves contacting a seed crystal with a melt of the crystal material contained in a heated crucible. The growth of large, substantially defect-free crystals by this and other methods remains to this day a difficult task, due to complications brought about by temperature gradients, convective eddies within the melt, and continuously changing thermal conditions.

Previous attempts at controlling the crystal growth process to improve the quality of the crystals produced have primarily involved controlling process parameters such as crucible or crystal rotation speeds, crystal pulling rate and total heat supplied to the crucible. The shape and stability of the solidification interface play an important part in achieving substantially defect-free large single crystals, and the shape and stability depend to a large extent on the flow patterns established in the melt. In practice, control of the crystal and crucible rotation rates have been used to attempt to control the flow pattern in the melt. Application of magnetic fields has also been used in attempting to suppress convective eddies within the melt to control the flow pattern, as well. The above approaches share the disadvantage that the controls tend to produce only bulk effects within the melt. Control or manipulation of the crystal and crucible rotation rates without regard to the prevailing thermal boundary conditions, as has been the practice, leads to inconsistent results. Further, the use of magnetic fields does not guarantee a stable flow regime under the solidification interface.

Heaters disposed below the melt in containers from which single crystals are pulled have heretofore been disclosed, however, these heaters have been designed without the ability to assist in controlling the melt flow pattern in the melt container by selectively controlling and adjusting the thermal gradient across the bottom of the vessel. U.S. Pat. No. 4,654,110, issued to Morrison, discloses a shallow angle sheet crystal puller wherein heating rods disposed in the bottom of the melt-containing vessel have gradually increasing (or decreasing) heating capacity to provide a predetermined temperature gradient in the melt, however, there appears to be no means provided by which variation from the single predetermined gradient could be accomplished.

U.S. Pat. No. 4,659,421, issued to Jewett, discloses a shallow pan-type melt container having more than one heater disposed at the bottom of the container. However, these heaters are designed and used in a manner to minimize the effect on melt flow within the melt container. This Jewett patent discusses in detail the recognition of problems associated with melt flow in the Czochralski crystal pulling process. The invention is directed to a crystal pulling process which is quite different from the Czochralski method in that neither the crystal nor the melt container is rotated during the pulling process, and melt flow within the container is restricted by baffles, and is desirably kept to a minimum. The only desired melt flow using the apparatus and process in this patent is from below the feedstock area to below the crystal pulling area, and the melt flow is controlled either by the pumping action of the feed rod into the melt or by argon gas pressure in the region surrounding the feed rod. No suggestion is made in this patent to selectively control the thermal gradient across the bottom of a crucible to control the melt flow pattern to assist in controlling the shape of the solidification interface.

It is therefore a principal object of the present invention to provide an apparatus which is suitable for controlling the melt flow pattern within a crucible to establish and preserve a desired solidification interface shape.

It is a further principal object of the present invention to provide a method for establishing and maintaining a desired solidification interface shape in a melt by controlling the melt flow pattern within a crucible.

It is an additional object of the present invention to provide heating means disposed at the base of a crucible, and heating means having independently controllable heating elements and being adapted to be moved vertically in conjunction with the crucible to maintain a substantially constant distance between the heating means and the crucible.

It is an additional object of the present invention to provide a method for establishing a stable solidification interface shape by controlling a temperature gradient at a lower portion of the melt whereby a predetermined desired melt flow pattern is created and maintained.

SUMMARY OF THE INVENTION

The above and other objects of the present invention are accomplished by providing a vertically movable radial gradient heater disposed in a position to heat the bottom of the crucible to produce a desired radial temperature gradient or distribution across the bottom of the crucible, which may be used to help establish and maintain a predetermined desired flow pattern in the melt disposed within the crucible, from which melt the crystal is pulled. The heater has individually controllable elements so that a precise radial temperature gradient may be accomplished.

The method of the present invention for establishing a stable solidification interface shape uses the radial gradient heater to control the melt flow pattern by producing a predetermined radial temperature gradient across the bottom of the crucible.

The relative strength of the flows induced by the rotations of the crystal and crucible and the flows caused by buoyancy force in the melt will determine the nature and the stability of the melt flow pattern. In the present invention, it has been recognized that as the melt level in the crucible decreases during the crystal growth process, due to the melt volume being drawn into a solidified single crystal, the flow induced by crystal rotation begins to dominate over the buoyancy-driven flow, which creates an unstable flow regime under the growth interface. This instability in certain instances works to change the flow pattern within the melt from the preferred single-cell flow pattern, which produces a desirable convex solidification interface shape, to a two-cell flow pattern, wherein the interaction of the primary and secondary cells produces an undesirable concave solidification interface shape.

It has further been determined in connection with the development of the present invention that the thermal boundary condition along the bottom interior portion of the crucible plays a significant role in establishing the flow pattern in the melt. Thus, by appropriately controlling the temperature gradient along the bottom of the crucible, the thermal conditions in the melt will produce the desired flow pattern and solidification interface shape.

The heater to be used in controlling the radial temperature gradient, in addition to having individually controllable heating elements, will also be provided with the ability to move vertically along the crystal pulling axis in concert with the crucible, when the crucible is raised during the crystal growth process as the melt level in the crucible decreases, in order to maintain the level of the solidification interface at a substantially constant height.

BRIEF DESCRIPTION OF THE DRAWINGS

These and other features of the present invention and the attendant advantages will be readily apparent to those having ordinary skill in the art, and the invention will be more easily understood from the following detailed description of the preferred embodiment of the present invention, taken in conjunction with the accompanying drawings, wherein like reference characters represent like parts throughout the several views, and wherein:

FIG. 5 is a graphical representation of the shape of the liquid-solid interface in the crucible, depicting the solidification interface shape when the melt is undergoing two-cell flow and single-cell flow.

DETAILED DESCRIPTION OF THE PREFERRED EMBODIMENT

Figure 1:
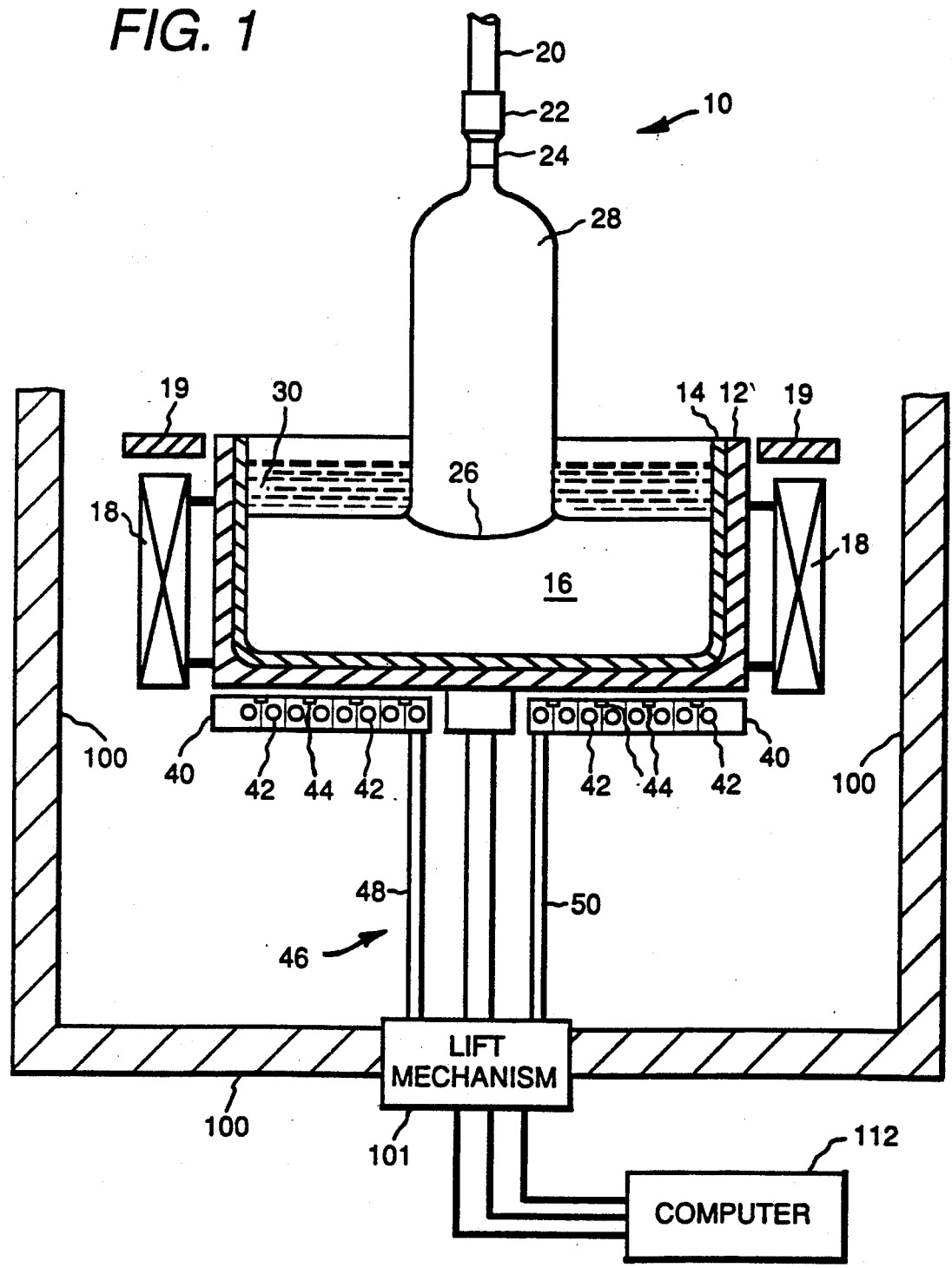
FIG. 1 depicts a cross-sectional elevation view of an apparatus for pulling a single crystal from a melt having a heating means in accordance with a preferred embodiment of the present invention.

Referring initially to FIG. 1, an apparatus, designated by numeral 10, for growing single crystals according to preferred embodiment of the present invention is shown. This preferred embodiment will be suitable for growing crystals by the Czochralski-type crystal pulling method, the basic features of which are well known in the art.

The apparatus 10 comprises a crucible 12 which, in the depicted preferred embodiment, has a close-fitting liner 14 adapted to contain a melt 16 of the material to be pulled into a crystal. Except where indicated later in the specification, crucible 12 is of conventional design, and may be retained in a frame in a stationary manner. Preferably, however, crucible 12 is mounted in a suitable frame, shown schematically as numeral 100, in a known manner, such that the crucible is capable of being rotated about a central vertical axis and capable of being raised and lowered in the frame by a vertical lift and rotation mechanism, also shown schematically as numeral 101. The mounting of a crucible in a frame adapted to rotate and lift the crucible is well known in the art, and does not specifically form a part of the present invention.

The liner 14 employed inside crucible 12 is provided to isolate the melt 16 from the walls of the crucible. At the melt temperatures involved in this crystal growing process, the material from e walls of the crucible is prone to being taken into solution in the melt 16, and therefore tends to contaminate the melt and the crystal grown therefrom. The liner material is therefore preferably selected, as is known in the art, to be resistant to reaction with the melt at the temperatures experienced during the crystal growing process. Two examples of preferred liner materials are pyrolytic boron nitride, which is preferably used when a Ga-As melt is being pulled into a Ga-As crystal, and iridium, which is preferably used in pulling Nd-YAG crystals. The outer wall of crucible 12 may be made of graphite or other suitable material.

Surrounding the crucible 12 around a circumference thereof, and preferably extending along a predetermined vertical height, is a side heater (or heaters), shown schematically at 18. Examples of such heaters are well known in the art, and the heater may preferably comprise a graphite heater. This external heater 18 is employed to keep the bulk temperature of the melt at a predetermined level. An annular baffle 19 is provided in the depicted preferred embodiment at a location above heater 18, the baffle being employed as a barrier to retain the heat generated by heater 18 down at the level of the crucible.

The apparatus 10 further comprises a pulling rod 20, which is preferably adapted to be rotated about its longitudinal axis, and is constructed to be capable of vertical movement at a controlled rate with respect to melt 16. Pulling rod 20 has a chuck 22 disposed at a lower end to which a crystal seed 24 is attached in a manner well known in Czochralski crystal growth methods. As in previously disclosed Czochralski processes, the seed 24 is brought into contact with the melt 16 at an upper central surface of the melt, and the pulling rod 20, chuck 22, and seed 24 are pulled vertically upwardly, and preferably are concurrently rotated in drawing the molten material from the melt. The material solidifies along a solidification front or interface 26, forming a single crystal 28 grown as an extension of the seed 24. The solidification interface 26 is preferably retained at a substantially constant height throughout the crystal pulling process by vertically raising crucible 12 as the upper surface of the melt sinks within the interior of the crucible. Alternatively, the constant height may be maintained by supplying molten material into the crucible at the same rate at which molten material is drawn out and solidified. Methods for supplying the replacement molten material are well known, and do not specifically form a part of the present invention.

Depending upon the particular type of crystal being grown in the process, an encapsulating medium 30 may optionally be provided over the upper surface of the melt 16, as is known in the art. The use of the encapsulating medium has been shown to be effective in containing the elements in the melt in processes in which GaAs crystals are grown. The encapsulating medium is chosen such that it is lighter than the melt so that it will "float" on the surface, so that it will not contaminate the melt, and so that it will isolate the melt from the environment. A typical material employed as an encapsulating medium when growing GaAs crystals would be $B_2O_3$.

The apparatus 10 as described thus far is representative of a conventional Czochralski device. This device or apparatus is augmented, as will be discussed below, to produce the apparatus of the present invention, with which the method of the present invention may be performed.

Figure 3:
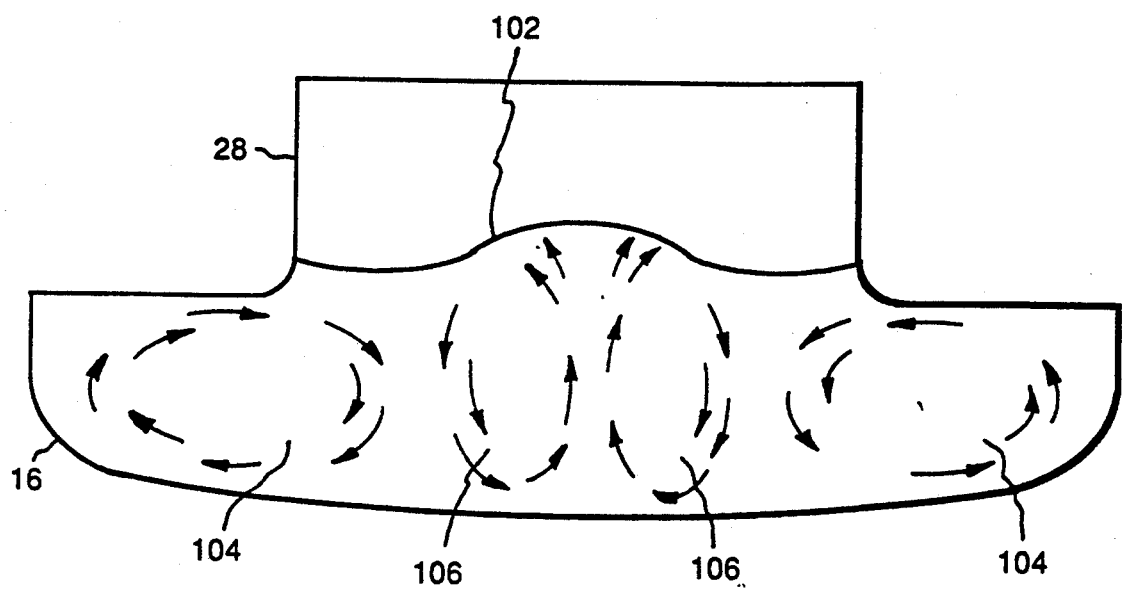
FIG. 3 is a diagrammatic representation of the melt flow conditions and the attendant solidification interface shape in a crucible wherein the melt is undergoing two-cell flow.
Figure 4:
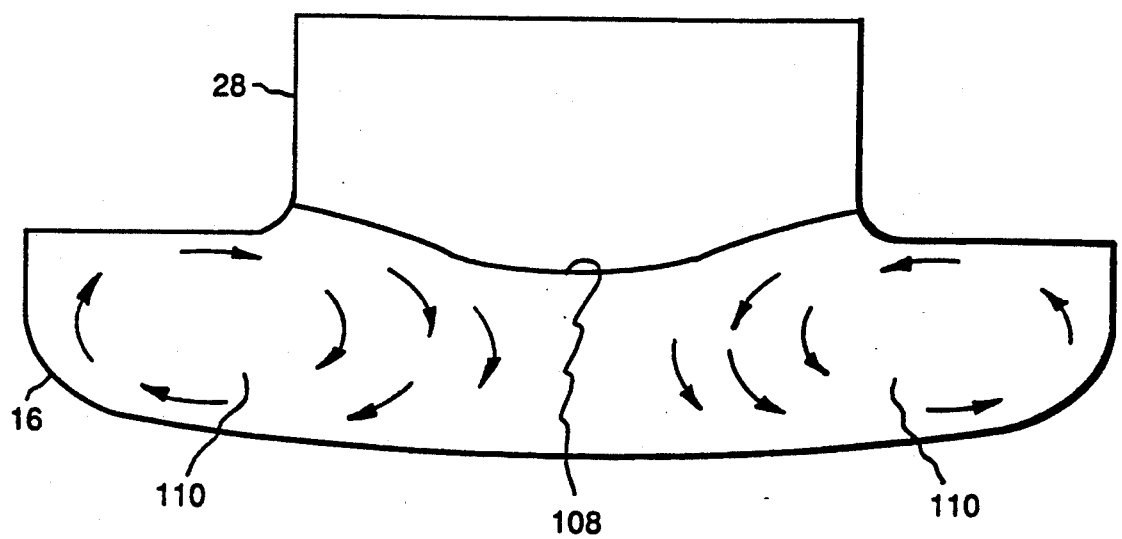
FIG. 4 is a diagrammatic representation of the melt flow conditions and the attendant solidification interface shape in a crucible wherein the melt is undergoing single cell flow in accordance with a preferred embodiment of the present invention.

The flow pattern in the melt 16 has a major influence on the shape and stability of the solidification interface 26. FIG. 3 depicts, in diagrammatic form, a concave solidification interface 102 resulting from what is known in the art as "two-cell" flow, wherein a first cell 104 and a second cell 106 having flow patterns moving in opposite directions form in the melt. FIG. 4 depicts, in diagrammatic form, the desired convex solidification interface 108, which forms when a single-cell flow pattern exists in the melt, wherein only one flow cell 110, moving substantially the entire melt in the pattern depicted, is formed.

In general, the occurrence of two-cell flow takes place when the forces in the melt induced by the rotation of the crystal are of sufficient strength relative to a buoyancy-driven flow and flow driven by crucible rotation, such that the second cell 106 forms as a result of the crystal rotation-induced forces and the first cell 104, having a flow in a different direction, continues as a result of the buoyancy forces, and forces induced by the rotation of the crucible. The second cell 106 tends to cause heated portions of the melt to rise in the manner depicted. The desired single-cell flow is present generally when the buoyancy-driven flow is sufficiently strong to prevent a second cell, representing melt flow in a different direction, from forming. As noted previously, the buoyancy forces decrease relative to the rotationinduced forces as the level of the melt decreases.

FIG. 5 provides an illustration comparing the two forms of solidification interface shape of interest herein, the term $\Delta Z_i$ referring to a vertical position of the solidification interface relative to a zero point which is the height or vertical position of the interface at the peripheral edge of the crystal being pulled. The vertical position $\Delta Z_i$ is plotted against a radial distance from the centerline of the crystal.

The convex solidification interface shape 108 produced by the single-cell flow pattern is preferred over the concave solidification interface shape 102, as the solidified material forming a crystal at this interface will generally have less induced stress in the crystal lattice, which has the desired result of yielding lower dislocation densities in the crystal. The increased stresses in crystals formed at concave solidification interfaces, resulting in higher dislocation densities, are believed to be present as a result of a greater unevenness in the rates of cooling and solidification across the diameter of the crystal being formed.

Studies leading to the development of the apparatus and method of the present invention have shown that factors such as heat transfer, melt convection and phase change all play a role in the shape of the solidification interface, and that the shape can be predicted taking these factors into account. Analyses conducted have shown that the thermal boundary condition along the bottom of the crucible 12 plays a significant role in establishing the flow pattern in the melt in influencing the relative strength of buoyancy forces. Control of the thermal boundary condition can be attained by controlling the temperature gradient across the bottom of the crucible 12 in a radial direction extending outwardly from a centerline of the crucible 12 about which the crucible is rotated. Therefore, in accordance with the preferred embodiment of the invention, the apparatus 10 is provided with a bottom heater 40, preferably in the form of a heater platform 40, disposed below the crucible and extending across substantially the entire lower surface of the crucible. The heater platform 40 is designed such that a positive radial temperature gradient can be produced and maintained across the lower surface of the crucible. As a result, the thermal boundary condition along the bottom of the crucible may be controlled to yield the desired melt flow pattern.

Figure 2:
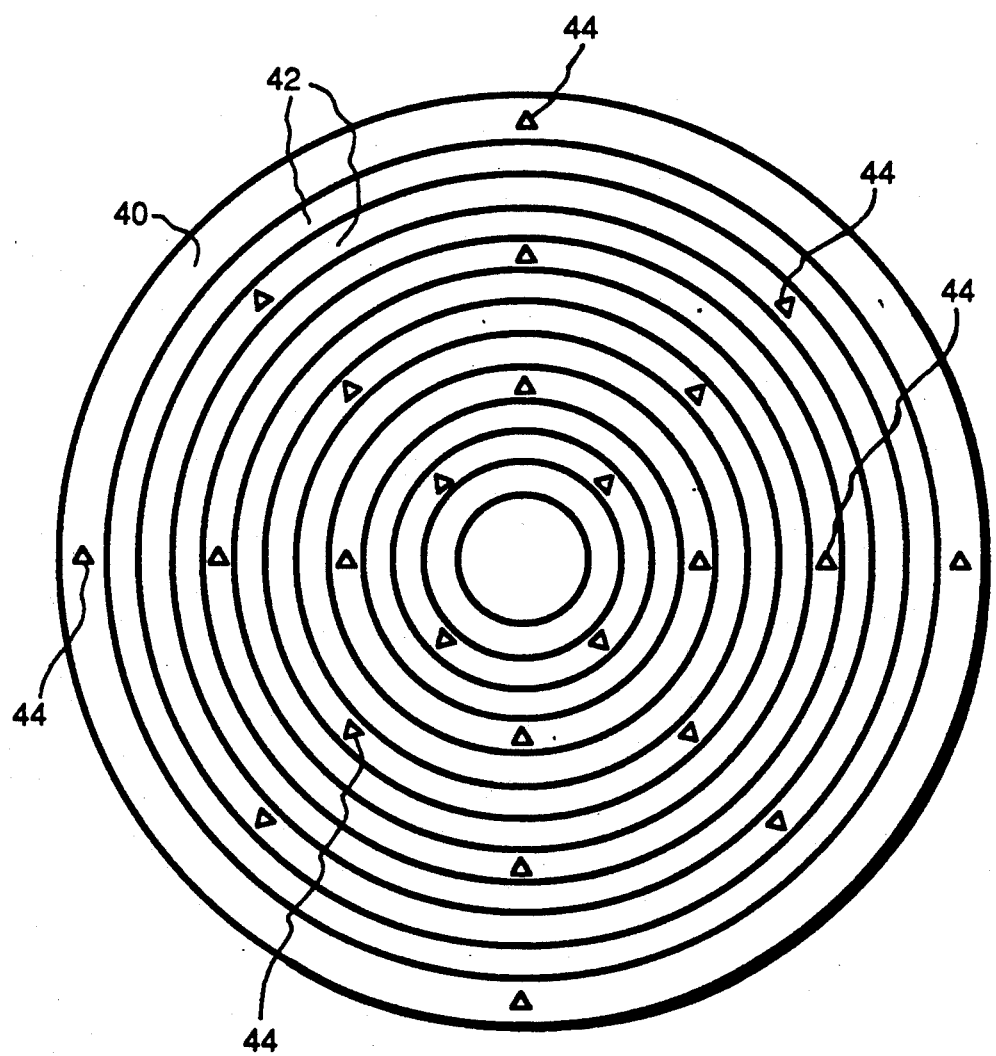
FIG. 2 is a substantially schematic top plan view of a heating means in accordance with a preferred embodiment of the present invention depicting a preferred arrangement of heating elements.

Heater platform 40 has a plurality of individually controllable heating elements 42, preferably arranged in a concentric manner, as can be seen in both FIGS. 1 and 2. The heating elements 42 may be arranged in positions other than the concentric pattern depicted, provided that the arrangement or pattern permits temperature gradient control in a radial direction extending outwardly from substantially a centerline of the crucible 12. The independent control of each of the heating elements may be effected in a manner which will be readily apparent to those having ordinary skill in the art, and the details of the connection of the heating elements to the control means have been omitted from this specification. The heating elements 42 may preferably comprise graphite rod heaters disposed in or on platform 40, the elements being formed into the annular shapes depicted in FIG. 2.

The selective control of the heating elements 42 to achieve the desired radial temperature gradient may be controlled by programmed commands being developed through the use of simulations or modeling of the melt flow conditions in the crystal pulling process. Alternatively, the control may involve measuring temperatures at a plurality of locations across the radial extent of the crucible by thermocouples 44, shown schematically in FIGS. 1 and 2. In the situation wherein thermocouple readings are employed in the control of the temperature gradient, computer 112 is used to receive signals or feedback from the thermocouples 44, and the computer uses this information, in a closed-loop system configuration, to control the individually controllable heating elements 42 as necessary to achieve and/or maintain the desired radial temperature gradient.

It should be noted that while thermocouples 44 are depicted as being mounted on heater platform 40 in the embodiment depicted in FIG. 1, the thermocouples could be disposed in other locations and still be able to provide readouts of the radial temperature gradient of the bottom of the crucible. One example of an alternative preferred positioning would be between main crucible structural wall 12 and crucible liner 14 across the lower extent of the crucible.

Further in accordance with a preferred embodiment of the present invention, the heater platform 40 is mounted on lifting means 46 as shown schematically in FIG. 1. As noted previously in the specification, in many instances the crucible 12 is raised during the course of pulling the crystal 28, in order to maintain upper level of the melt 30, and especially the solidification interface 26, at a substantially constant horizontal level. The crucible 12 is thus raised at a rate equal to the drop in the level of the melt due to the melt being extracted into the solidified crystal. In order to continue to control the radial temperature gradient across the bottom of the crystal, the heater platform 40 is preferably raised at substantially the same rate as crucible 12 by the lifting means 46, maintaining a constant distance between the bottom heater platform 40 and the lower surface of the crucible 12.

Both the crucible 12 and lifting means 46 for the heater platform 40, may be coupled to the same vertical lift mechanism 101, and the specific lifting means employed may be selected from devices known in the art, for example, a hydraulic system wherein piston-type members, shown schematically at 48, 50, telescope from cylinder means (not shown) in a manner which will be apparent to those skilled in the art. However, it may be preferable to employ separate lift systems for the crucible 12 and the heater platform 40, as it will generally be desired to rotate crucible 12 simultaneously with the lifting using the same mechanism, and it will not generally be necessary to rotate heater platform in the same manner.

By way of non-limiting example, the bottom heater 40 may be used in the following manner in a Czochralski crystal-pulling process. The side heater 18 is the primary heat source for the crucible which maintains the melt in its molten state. The buoyancy forces induced in the melt by side heater 18 tend to create a flow pattern wherein the material at the bottom of the crucible 12 moves radially outwardly and then upwardly adjacent to the crucible wall liner 14. The material then flows radially inwardly near an upper level of the melt and then downwardly in a center portion of the crucible. FIG. 4 is representative of this flow pattern. The buoyancy forces acting on the melt vary generally as a function of the height of the melt in the crucible, the buoyancy forces decreasing as the crystal is pulled from the melt and the melt level or height of the melt decreases.

At the start of the crystal pulling process, the buoyancy forces may be sufficiently strong to dominate over forces in the melt induced by the crystal and crucible rotation, which forces tend to create a flow pattern in a direction opposite the direction of the buoyancy force-driven flow pattern. Thus, in the early stages of the process, it may be possible to operate the apparatus with a single-cell flow pattern in the melt without the aid of bottom heater 40. However, it is preferred in the present invention to employ the bottom heater throughout the entire crystal pulling process, in order to ensure from the outset that the desired single-cell flow pattern is maintained in the crucible.

One preferred usage of bottom heater 40 is to produce and maintain a positive radial thermal gradient across the bottom of the crucible wherein the temperature of the bottom of the crucible increases in a radial direction from the center of the crucible extending outwardly to the peripheral edge of the bottom of the crucible. It has been determined that such a radial temperature gradient serves to reinforce the buoyancy forces and thus assists in the creation and maintenance of single-cell type flow in the melt. The difference between the temperature at the center of the bottom of crucible 12 and the peripheral edge of crucible 12 may preferably be relatively small when the crystal pulling is commenced due to the ability of the side heater 18 to induce single-cell flow. As the melt level drops during the pulling process, the buoyancy forces induced by side heater 18 become smaller, and in order to compensate for this and to maintain the dominance of the buoyancy driven flow pattern, the individually controlled heating element 42 of bottom heater 40 may be used to selectively adjust (increase) the temperature difference or radial temperature gradient extending from the center o the bottom of crucible 12 to the peripheral edge of the bottom of the crucible. This can be done by reducing the amount of heat or eliminating the heat added by the innermost heating elements and increasing the amount of heat added by the outermost heating elements. In this manner, the desired single-cell flow pattern can be maintained throughout the entire crystal pulling process.

As indicated previously, a control program may be developed for control computer 112 to provide the control of heating elements 42 based on experimental runs or based on process modeling or simulation directed to determining the radial temperature gradient necessary to maintain a single-cell flow pattern as a function of melt level. Such a program would preferably also take into account the rate of crystal growth being employed, in order to ascertain the rate at which the melt level will decrease. The heating elements could therefore be controlled as a function of time, without the necessity of monitoring the actual melt level in the crucible, using this information in the control program.

Thermocouples 44 may also be used in conjunction with control logic developed through experimentation or process simulation. In this manner, any undesired fluctuations in temperature across the radial extent of the bottom of the crucible could be corrected as the crystal-pulling process is carried out.

While the preferred use for the heater 40 containing individual heating elements 42 is for imposing a positive radial thermal gradient fostering a single-cell flow in the melt, it should be clear to those of ordinary skill in the art that the bottom heater 40 may be used to produce many different radial temperature profiles across the bottom of the crucible, if desired. The invention is not intended to be limited to use only in providing a positive radial temperature gradient.

It is therefore to be understood and recognized that the foregoing detailed description of the invention is given merely by way of illustration, and that numerous modifications and variations will be apparent to those skilled in the art without departing from the spirit and scope of the invention. Therefore, the scope of the invention is to be determined by reference to the appended claims.

What is claimed is:

1. Apparatus comprising:
   means for containing a melt of material to be grown into a crystal; and
   means for controlling a melt flow behavior in said melt containing means during a growing of crystal, said melt flow controlling means comprising a heater means having a plurality of individually controllable heating elements for selectively controlling a radial temperature gradient across a lower surface of said melt containing means.

2. Apparatus as recited in claim 1 wherein said heater means is disposed underneath and extends across said lower surface of said melt containing means.

3. Apparatus as recited in claim 2 wherein said plurality of heating elements are disposed in a spaced apart, concentric pattern.

4. Apparatus as recited in claim 3 wherein said heater means comprises a platform extending underneath and across substantially an entire lower surface of said melt containing means, and said plurality of concentrically disposed heating elements are disposed on said platform.

5. Apparatus as recited in claim 4 wherein said apparatus further comprises means for vertically lifting said melt containing means, and wherein said heater means further comprises means for vertically lifting said heater means.

6. Apparatus as recited in claim 1 further comprising means for monitoring a temperature distribution across said lower surface of said melt containing means.

7. Apparatus as recited in claim 5 further comprising means for monitoring a temperature distribution across said lower surface of said melt containing means.

8. Apparatus as recited in claim 7 wherein said temperature distribution monitoring means is disposed on said platform.

9. Apparatus as recited in claim 8 wherein said temperature distribution monitoring means comprises a plurality of thermocouples distributed across an upper surface of said heater platform.

10. Apparatus as recited in claim 1 further comprising means for raising said melt containing means to maintain a solidification interface between said melt and said crystal at a substantially constant level, and means for maintaining said heater means at a constant spacing from said melt containing means.

11. Apparatus for growing crystals by a Czochralski-type crystal pulling process comprising:

a crucible having a melt therein, said melt comprising the material to be solidified and grown into a crystal and;

means for controlling a melt flow pattern in said crucible, said melt flow pattern controlling means comprising a heater means disposed across a bottom of said crucible, said heater having means for selectively adjusting a radial temperature gradient across said bottom of said crucible.

12. Apparatus as recited in claim 11 wherein said heater means comprises a plurality of individually controllable elements.

13. Apparatus as recited in claim 12 wherein said plurality of heating elements are disposed in a spaced apart, concentric pattern.

14. Apparatus as recited in claim 13 wherein said heater means comprises a platform extending underneath and across substantially an entire bottom surface of said crucible, and wherein said plurality of concentrically disposed heating elements are disposed on said platform.

15. Apparatus as recited in claim 14 wherein said apparatus further comprises means for vertically lifting said crucible, and wherein said apparatus further comprises means for maintaining said heater platform at a constant spacing from said bottom surface of said crucible.

16. Apparatus as recited in claim 15 wherein said means for maintaining said heater platform at said constant spacing comprises means for vertically lifting said heater platform.

17. Apparatus as recited in claim 11 further comprising means for monitoring said radial temperature gradient across said bottom of said crucible, and wherein said radial temperature monitoring means is operatively coupled to said means for selectively adjusting said radial temperature gradient.

* * * * *